United States Patent
Nagayama et al.

(10) Patent No.: US 6,285,124 B1
(45) Date of Patent: Sep. 4, 2001

(54) ORGANIC EL DISPLAY PANEL HAVING A CONDUCTIVE HIGH POLYMER LAYER BETWEEN AN ANODE LAYER AND AN ORGANIC EL LAYER

(75) Inventors: Kenichi Nagayama; Atsushi Ogasawara, both of Yamagata; Hitoshi Nakada, Tokyo, all of (JP)

(73) Assignees: Pioneer Electronic Corporation, Tokyo; Tohoku Pioneer Electronic Corporation, Yamagata-ken, both of (JP)

( * ) Notice: Subject to any disclaimer, the term of this patent is extended or adjusted under 35 U.S.C. 154(b) by 0 days.

(21) Appl. No.: 09/225,488

(22) Filed: Jan. 6, 1999

(30) Foreign Application Priority Data

Jan. 6, 1998 (JP) ................................. 10-012110

(51) Int. Cl.$^7$ ................................. H01J 1/62; H01J 63/04
(52) U.S. Cl. ........................... 313/506; 313/504; 313/503; 345/82
(58) Field of Search ....................... 312/506, 495, 312/496, 497, 498, 500, 501, 502, 503, 504, 505, 507, 508, 509

(56) References Cited

U.S. PATENT DOCUMENTS

| | | | |
|---|---|---|---|
| 4,757,235 | * 7/1988 | Nunomura et al. | 313/506 |
| 4,792,500 | * 12/1988 | Kojima | 313/506 |
| 5,626,795 | 5/1997 | Smith et al. | 252/500 |
| 5,705,888 | * 1/1998 | Staring et al. | 313/503 |
| 5,719,467 | 2/1998 | Antoniadis et al. | 313/506 |
| 5,902,689 | * 5/1999 | Vleggaar et al. | 313/504 |
| 6,002,206 | * 12/1999 | Harrison et al. | 313/506 |
| 6,014,119 | * 1/2000 | Staring et al. | 345/82 |

FOREIGN PATENT DOCUMENTS

| | | | |
|---|---|---|---|
| 9-45479 | 2/1997 | (JP) | H05B/33/20 |
| WO 96/08047 | 3/1996 | (WO) | H01L/51/10 |
| WO 97/23452 | 7/1997 | (WO) | C07C/319/28 |

* cited by examiner

*Primary Examiner*—Nimeshkumar D. Patel
*Assistant Examiner*—Mariceli Santiago
(74) *Attorney, Agent, or Firm*—Sughrue, Mion, Zinn, Macpeak & Seas, PLLC

(57) ABSTRACT

An organic EL display panel having a substrate; a plurality of anode layers laminated on the substrate in a laminating direction and arranged with intervals in a direction perpendicular to the laminating direction. A high polymer layer is laminated on the anode layers; an organic EL layer is laminated on the high polymer layer; and a plurality of cathode layers is laminated on the organic EL layer in a laminating direction and arranged with spaces in a direction perpendicular to the laminating direction. The high polymer layer has an energizing region facing the cathode layers, and a gap region is disposed between the adjacent anode layers. The gap region has a conductivity lower than the energizing region. Further, a method for producing the organic EL display panel is disclosed.

7 Claims, 3 Drawing Sheets

ORGANIC EL DISPLAY PANEL HAVING A CONDUCTIVE HIGH POLYMER LAYER BETWEEN AN ANODE LAYER AND AN ORGANIC EL LAYER

FIELD OF THE INVENTION

The present invention relates to an organic EL (Electroluminescence) display panel and its manufacturing method, and particularly to an organic EL display panel and its manufacturing method using a conductive high polymer layer between an anode layer and an organic EL layer.

BACKGROUND OF THE INVENTION

A display panel has been known which uses an organic electroluminescence element (hereinafter referred to as "organic EL element) which passes a current through a fluorescent body formed on a glass plate or a transparent organic film to emit light. The organic EL element, as shown in FIG. 4, includes an organic layer 2 comprising a plurality of transparent electrodes of ITO, a conductive high polymer layer 104 for improving reliability, an organic EL layer 3 comprising a hole transporting layer and a light emitting layer, and a cathode layer 1 comprising a plurality of metallic electrodes intersecting the anode layer 2. These layers are successively stacked on a transparent substrate 6 of glass or the like. The anode layer 2 and cathode layer 1, between which the organic EL layer 3 intervenes and which are opposite to each other to form a couple, constitutes a light emitting portion serving as an organic EL layer 3. An intersecting region where each of the transparent electrodes of the anode layer 2 and each of the metallic electrodes of the cathode layer 1 are opposite to intersect constitutes a pixel of one unit.

As the cathode 1, a metal having a small work function such as an alloy of Al, In, Ag, etc. (e.g. Al-Li alloy) is used. As the anode layer 2, a conductive material having a large work function of ITO (work function of ITO=about 0.5 eV) or gold (work function of Au=about 5.1 eV) is used. When gold is used as an electrode material, the electrode is made semi-transparent.

As the high polymer layer 104, polyaniline is used. Improvement of reliability in the conductive high polymer layer is disclosed in JP-A-9-45479. (The term "JP-A" as herein means "unexamined published Japanese patent application".)

When the technique for improving reliability by the conductive high polymer layer is adopted for a display panel having a structure where an anode and cathode are divided into plural regions, such as a dot matrix, because the resistance of the conductive high polymer layer is low, the adjacent anode regions are electrically connected to each other and hence crosstalk occurs. Namely, even when a current is not passed through the anode in order that the pixel on a certain anode does not emit light, the current flows from the adjacent anode because the electric resistance of the high polymer layer is low. Thus, the pixel which should not emit light will emit light. As a result, a desired image cannot be obtained.

SUMMARY OF THE INVENTION

An object of the present invention is to provide an organic EL display panel with improved reliability and a method of manufacturing it in such a manner that after a high polymer layer has been deposited on an anode layer, a desired region is made conductive or non-conductive to form the conductive high polymer layer thereon.

In order to solve the above problem, an organic EL display panel defined in a first aspect of the present invention comprises a plurality of anode layers laminated on a substrate and arranged with intervals in a direction perpendicular to the laminating direction (hereinafter sometimes simply referred to as a plurality of anode layers at intervals), a high polymer layer made of polymeric material, an organic EL layer and a plurality of cathode layers arranged with spaces (intervals) in a direction perpendicular to the laminating direction, these layers being successively stacked, and characterized in that gap regions corresponding to the intervals in the high polymer layer (gap regions disposed between the adjacent anode layers) are formed to have a lower conductivity than regions corresponding to the anode layers (energizing regions facing the cathode layers).

The organic EL display panel defined in a second aspect of the present invention is an organic EL display panel according to the first aspect of the present invention, wherein the gap regions of the high polymer layer are insulating (insulative)

The organic EL display panel defined in a third aspect of the present invention is an organic EL display panel comprising a plurality of anode layers formed to be arranged at predetermined intervals on a substrate, and a conductive high polymer layer, an organic EL layer and a cathode layer, these layers being successively stacked on the anode layers, wherein the conductive high polymer layer, after it has been stacked, is subjected to a conductivity reducing step of reducing the conductivity of gap regions corresponding to the intervals.

The organic EL display panel defined in a fourth aspect of the present invention is an organic EL display panel according to the third aspect of the present invention, wherein the gap regions of the conductive high polymer layer is made insulating by the conductivity reducing step.

The organic EL display panel defined in a fifth aspect of the present invention is an organic EL display panel according to the third or fourth aspect of the present invention, wherein the conductive high polymer is made of polyaniline mixed with camphor-sulfonic acid, and the conductivity reducing step is carried out in such a manner that the gap regions of the conductive high polymer layer is immersed in an alkaline solution.

The organic EL display panel defined in a sixth aspect of the present invention is an organic EL display panel comprising a plurality of anode layers formed to be arranged at intervals on a substrate, a non-conductive high polymer layer, which can be imparted conductivity, formed thereon, and an organic EL layer and a cathode layer which are successively stacked on the non-conductive high polymer layer, wherein the non-conductive high polymer layer, after it has been stacked, is subjected to a conductivity imparting step of reducing the conductivity of energizing regions corresponding to the anode layers.

The organic EL display panel defined in a seventh aspect of the present invention is an organic EL display panel according to the sixth aspect of the present invention, wherein the non-conductive high polymer is made of polyaniline, and the conductivity imparting step is carried out in such a manner that the energizing regions are immersed in an acidic solution.

The method defined in a eighth aspect of the present invention is a method of manufacturing an organic EL display panel comprising the steps of: forming a plurality of a plurality of anode layers so as to be arranged at predetermined intervals on a substrate; stacking a conductive high polymer layer on the substrate so as to cover the plurality of anode layers; reducing the conductivity of gap regions corresponding to the intervals of the conductive high polymer layer; and successively stacking an organic EL layer and a cathode layer on the conductive high polymer layer.

The method defined in ninth aspect of the present invention is a method of manufacturing an organic EL display panel according to the eight aspect of the present invention, wherein the step of reducing conductivity is to make the gap regions insulating.

The method defined in a tenth aspect of the present invention is a method of manufacturing an organic EL display panel according to the eighth or ninth aspect of the present invention, wherein the conductive high polymer layer is polyaniline mixed with camphor-sulfonic acid, and the conductivity reducing step is carried out in such a manner that the gap regions of the conductive high polymer layer is immersed in an alkaline solution.

The method defined in a eleventh aspect of the present invention is a method of manufacturing an organic EL display panel comprising the steps of: forming a plurality of anode layers so as to be arranged at intervals on a substrate, stacking a non-conductive high polymer layer, which can be imparted conductivity, on the substrate so as to cover the plurality of anode layers; imparting conductivity to energizing regions corresponding to the anode layers of the non-conductive high polymer layer; and successively stacking an organic EL layer and a cathode layer on the conductive high polymer layer.

The method defined in a twelfth aspect of the present invention is a method of manufacturing an organic EL display panel according to the eleventh aspect of the present invention, wherein the non-conductive high polymer is made of polyaniline, and the conductivity imparting step is carried out in such a manner that the energizing regions are immersed in an acidic solution.

In accordance with the present invention, since electric connection between adjacent anode layers can be avoided, in a matrix display having a high polymer layer, the crosstalk which was problematic can be minimized.

DETAILED DESCRIPTION OF THE INVENTION

Now referring to FIG. 1, an explanation will be given of the first embodiment of the present invention.

Figure 1:
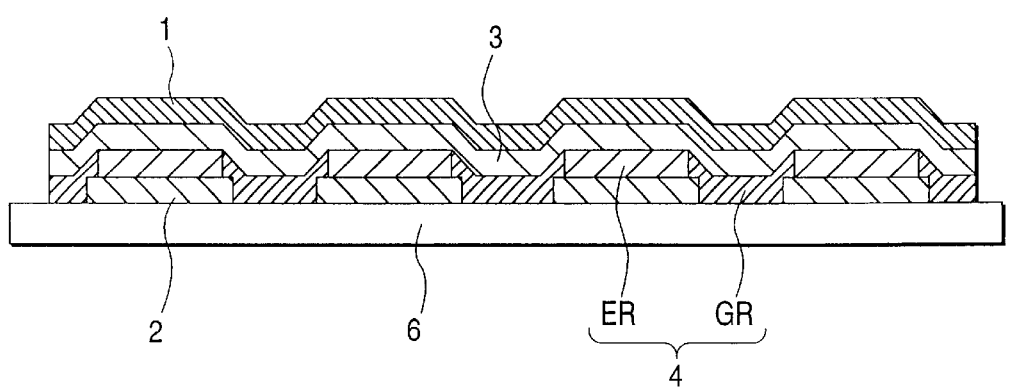
FIG. 1 is a partial sectional view showing an organic EL display panel according to the present invention.
Figure 4:
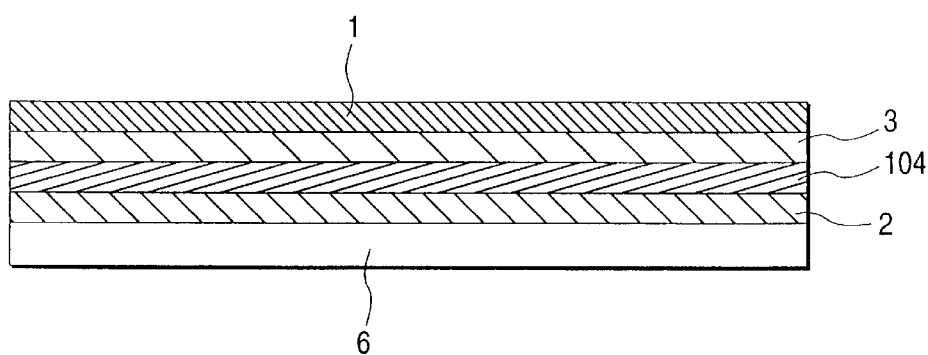
FIG. 4 is a partial sectional view showing a conventional organic EL display panel.

FIG. 1 is a partial sectional view of the structure of an organic EL display panel according to the present invention.

As shown in FIG. 1, an organic EL display panel includes a plurality of anode layers 2 of ITO, a high polymer layer 4, an organic EL layer 3 comprising a hole transporting layer and light emitting layer, and cathode layers 1 comprising a plurality of metal electrodes intersecting the anode layers.

The regions are successively stacked in the order described above on a transparent substrate 6 made of glass or the like. The plurality of anode layers 2, which are belt-shaped, respectively, are arranged in parallel to each other at predetermined intervals.

The plurality of cathode layers 1, which are belt-shaped like the anode layers 2, respectively, are arranged in parallel to each other at predetermined intervals. The cathode layers 1 and anode layers 2 are substantially orthogonal to each other in their extending direction. The regions where these layers intersect each other, i.e. the regions of the organic EL layer 3 sandwiched between the cathode layers 1 and anode layers 2 constitute light emitting regions and correspond to respective pixels.

The cathode layers 1 are made of a metal (e.g. Al–Li alloy) having a small work function such as an alloy of Al, In, or the like. The anode layers 2 are made of a conductive material having a large work function such as ITO, or made of gold (Au). The electrode made of Au is in a semi-transparent state.

The high polymer layer 4 is formed so that its regions (energizing regions: ER) which face the anode layers 2 are made conductive, and its regions (gap regions: GR) corresponding to the intervals between the adjacent anode layers 2 are not conductive.

In this configuration, without increasing the resistance between the cathode layers 1 and anode layers 2 in the light emitting regions, the adjacent anode layers can be electrically isolated so that the crosstalk can be avoided without deteriorating the light emitting characteristic of the display.

As seen from the figure, the gap region of the high polymer layer 4 is caused to extend over the edge of each of the anode layers 2 so that the leak-out of a current from the edge can be restrained.

An explanation will be given of a process for manufacturing a high polymer layer 4 according to the present invention.

Embodiment 1

Figure 2A:
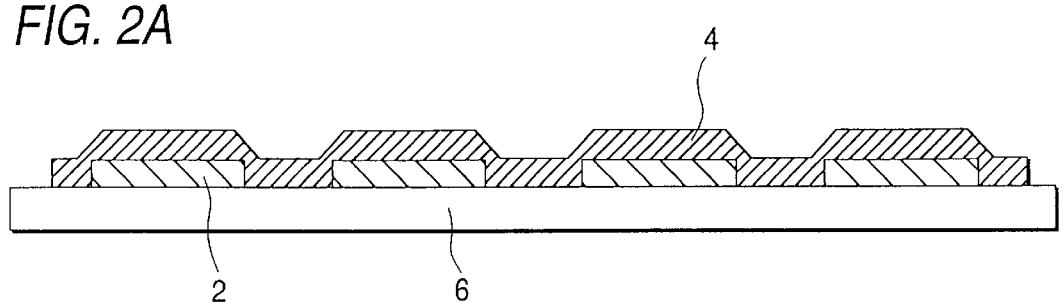
FIGS. 2A to 2D are views showing the manufacturing process according to the first embodiment of an organic EL display panel according to the present invention.

The first embodiment adopts a step of forming a conductive high polymer layer once, and reducing the conductivity of the areas of the high polymer layer thus formed, corresponding to the gaps of the anode layers 2. As shown in FIG. 2A, a transparent substrate 6 such as glass with ITO constituting the anode layers 2 patterned in stripes is sufficiently cleaned. Thereafter, a conductive high polymer layer 4 is formed on the substrate 6 inclusive of the anode layers 2 thus patterned. In this case, the conductive high polymer layer 4 is formed in such a manner that a polyaniline (PAn) solution mixed with camphor-sulfonic acid (CSA) is laminated by spin coating, and dried by a clean oven to deposit a CSA-doped PAn layer having a thickness of 500 A.

Figure 2B:
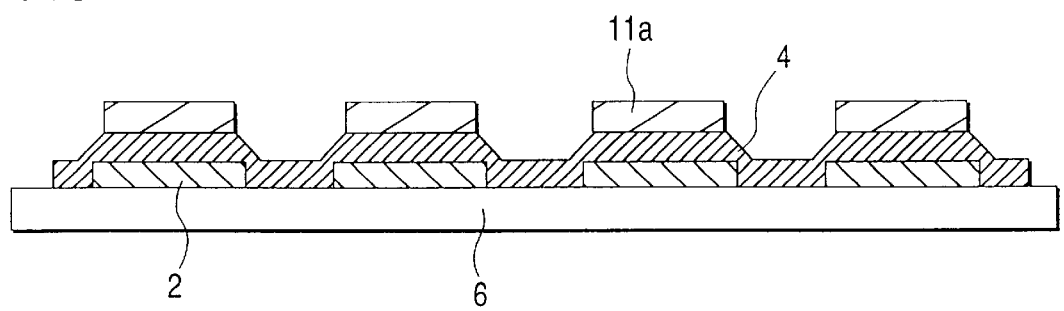
Figure 2C:
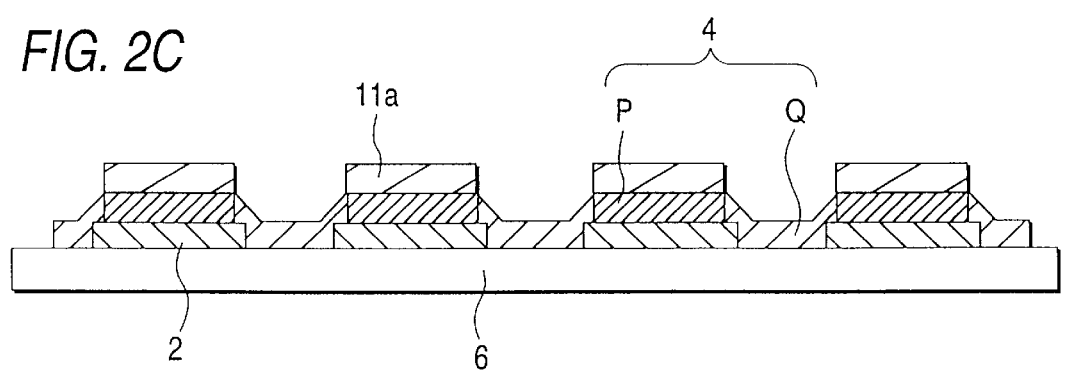

A photoresist 11a (OFPR-800LB) available from TOKYO OUKA is laminated by spin coating, and photoresist patterns are formed at pixel portions though a predetermined step (FIG. 2B). The substrate thus formed is immersed in an ammonium solution to eliminate the doping of the CSA-doped PAn layer at the areas other than the pixels (FIG. 2C).

Figure 2D:
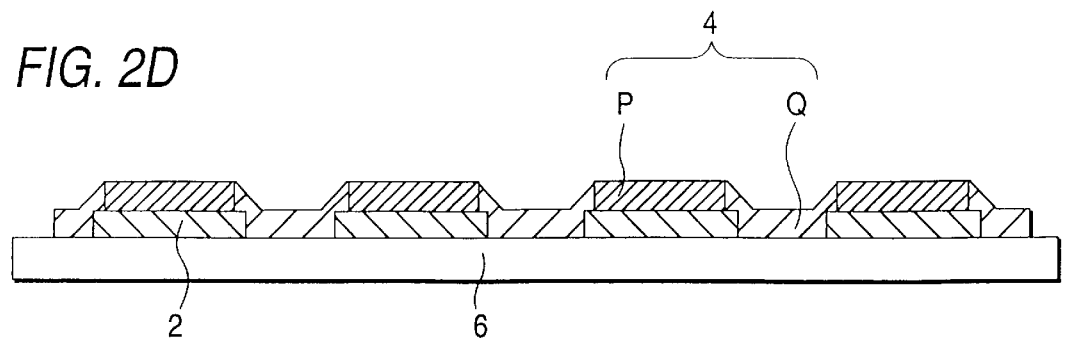

Finally, the photoresist 11a is eliminated to complete the high polymer layer 4 (FIG. 2D). Thereafter, the organic EL layer inclusive of an emitting layer and a cathode layer are successively stacked.

Since the doping is eliminated, of the conductive high polymer layer 4, the areas Q corresponding to the intervals between the anodes have lower conductivity than that of the areas P corresponding to the anodes.

Finally, sealing is performed to complete an organic EL display panel. As a result of a display action using a prototype of the organic EL display panel having 256×64 dots, a light emitting state with no crosstalk has been obtained.

Embodiment 2

Figure 3A:
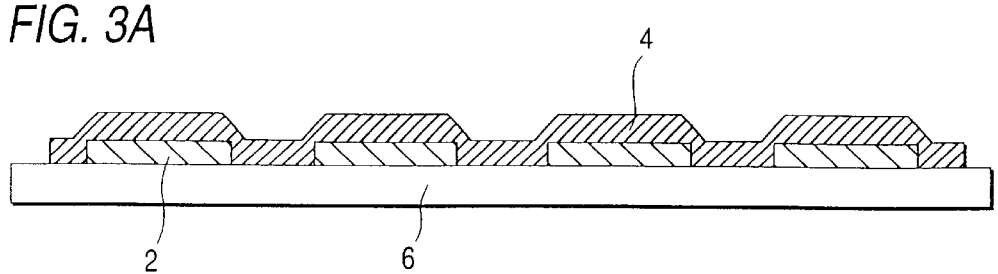
FIGS. 3A to 3D are views showing the manufacturing process according to the second embodiment of an organic EL display panel according to the present invention.

The second embodiment adopts a step of forming a non-conductive high polymer layer once, and imparting conductivity to the regions of the high polymer layer thus formed, facing the anode layers 2. As shown in FIG. 3A, a transparent substrate 6 such as glass with ITO constituting the anode layers 2 patterned in stripes is sufficiently cleaned. Thereafter, a non-conductive high polymer layer 4 is formed on the substrate 6 inclusive of the anode layers 2 thus patterned. In this case, the non-conductive high polymer 4 is formed in such a manner that a polyaniline (PAn) is laminated by spin coating, and dried by a clean oven to deposit a PAn layer having a thickness of 500 A.

Figure 3B:
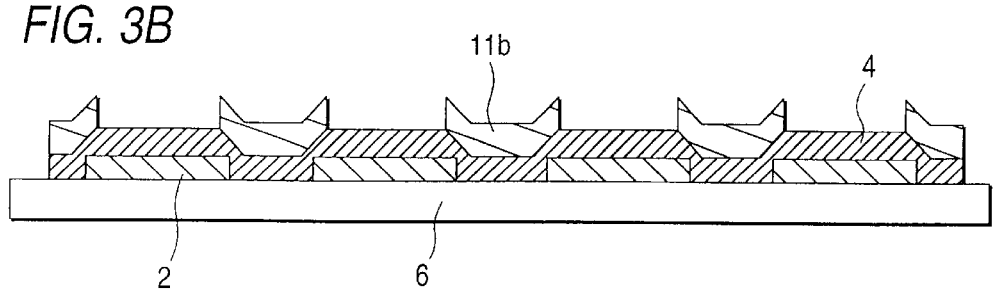
Figure 3C:
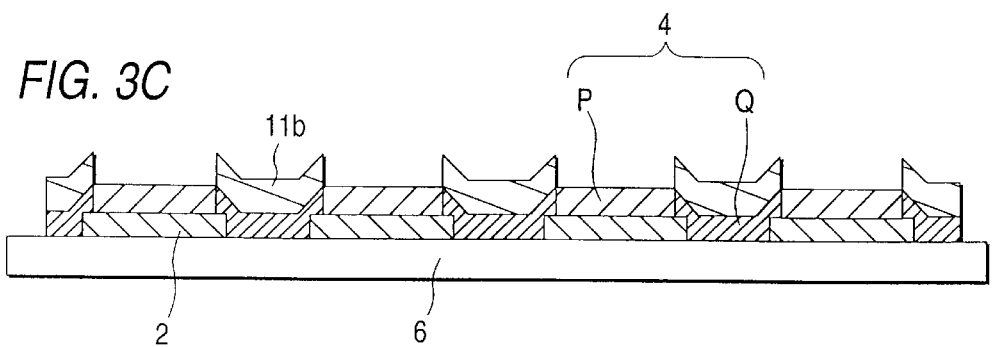

A photoresist 11b (OFPR-800LB) available from TOKYO OUKA is laminated by spin coating, and photoresist patterns are formed at the gap regions between adjacent anodes though a predetermined step (FIG. 3B). The substrate thus formed is immersed in a sulfuric acidic solution to effect the doping of the PAn layer at the areas corresponding to the pixels (FIG. 3C).

Figure 3D:
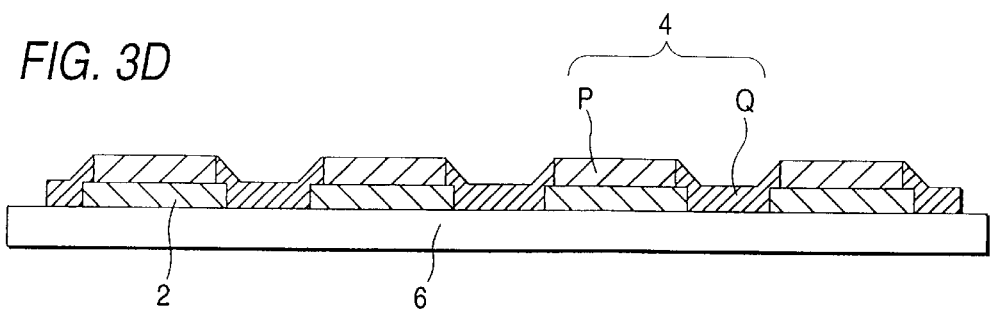

Finally, the photoresist 11a is eliminated to complete the high polymer layer 4 (FIG. 3D). Thereafter, the organic EL layer inclusive of an emitting layer and a cathode layer are successively stacked.

Since the doping is effected, in the non-conductive high polymer layer 4, the areas P corresponding to the anodes are made conductive while the areas Q corresponding to the gaps between the anodes remain non-conductive.

Finally, sealing is performed to complete an organic EL display panel. As a result of a display action using a prototype of the organic EL display panel having 256×64 dots, a light emitting state with no crosstalk has been obtained.

Incidentally, the regions (gap regions) of the high polymer layer 4, which have been made non-conductive, are most preferably insulating. However, as long as they have lower conductivity than the regions (energizing regions: ER), which have been made conductive, occurrence of crosstalk can be restrained as compared to the prior art.

The regions (energizing regions: ER) of the high polymer layer 4, which have been made conductive, may be caused to correspond to the light emitting regions where the cathode layers 1 and the anode layers 2 intersect each other while the other remaining regions may be made non-conductive.

Effects of the Invention:

As described above, in accordance with the present invention, since electric connection (energizing) between adjacent anode layers can be avoided to the utmost, the crosstalk which was problematic can be minimized so that an more improved image can be obtained than before.

What is claimed is:

1. An organic EL display panel comprising:

a substrate;

a plurality of anode layers laminated on said substrate in a laminating direction and arranged with intervals in a direction perpendicular to the laminating direction;

a high polymer layer laminated on said anode layers;

an organic EL layer laminated on said high polymer layer; and a plurality of cathode layers laminated on said organic EL layer in a laminating direction and arranged with spaces in a direction perpendicular to the laminating direction, wherein said high polymer layer comprises: an energizing region facing said cathode layers; and a gap region disposed between said adjacent anode layers, wherein said gap region has a conductivity lower than said energizing region.

2. An organic EL display panel according to claim 1, wherein said gap region of said high polymer layer is insulative.

3. An organic EL display panel comprising a substrate having laminated thereon a plurality of anode layers arranged with intervals in a direction perpendicular to the laminating direction, a conductive high polymer layer, an organic EL layer, and a plurality of cathode layers arranged with spaces in a direction perpendicular to the laminating direction, in this order, wherein said conductive high polymer layer comprises: an energizing region facing the cathode layers; and a gap region disposed between said adjacent anode layers, wherein said conductive high polymer layer is subjected to a conductivity reducing step of reducing the conductivity of said gap region, after said conductivity high polymer has been laminated on said anode layers.

4. An organic EL display panel according to claim 3, wherein said gap region of said conductive high polymer layer is made insulative by said conductivity reducing step.

5. An organic EL display panel according to claim 3 or 4, wherein said conductive high polymer comprises polyaniline mixed with camphor-sulfonic acid, and said conductivity reducing step is carried out in such a manner that said gap region of said conductive high polymer layer is immersed in an alkaline solution.

6. An organic EL display panel comprising a substrate having laminated thereon a plurality of anode layers arranged with intervals in a direction perpendicular to the laminating direction, a non-conductive high polymer layer capable of being imparted conductivity, an organic EL layer, and a plurality of cathode layers arranged with spaces in a direction perpendicular to the laminating direction, in this order, wherein said non-conductive high polymer layer comprises: an energizing region facing said cathode layers; and a gap region disposed between said adjacent anode layers, wherein said non-conductive high polymer layer is subjected to a conductivity imparting step of increasing the conductivity of the energizing region, after said non-conductive high polymer has been laminated on said anode layers.

7. An organic EL display panel according to claim 6, wherein said non-conductive high polymer layer comprises polyaniline, and said conductivity imparting step is carried out in such a manner that said energizing region is immersed in an acidic solution.

* * * * *